US005767512A

United States Patent [19]

Eiden et al.

[11] Patent Number: 5,767,512

[45] Date of Patent: Jun. 16, 1998

[54] METHOD FOR REDUCTION OF SELECTED ION INTENSITIES IN CONFINED ION BEAMS

[75] Inventors: Gregory C. Eiden; Charles J. Barinaga; David W. Koppenaal, all of Richland, Wash.

[73] Assignee: Battelle Memorial Institute, Richland, Wash.

[21] Appl. No.: 583,324

[22] Filed: Jan. 5, 1996

[51] Int. Cl.$^6$ .......... B01D 59/44; H01J 49/00; H01J 37/08

[52] U.S. Cl. .......... 250/282; 250/423 R; 250/288

[58] Field of Search .......... 250/282, 288, 250/287, 423 R

[56] References Cited

U.S. PATENT DOCUMENTS

| | | | |
|---|---|---|---|
| 4,551,624 | 11/1985 | Spangler et al. | 250/282 |
| 4,613,755 | 9/1986 | Hudgens | 250/282 |
| 4,686,365 | 8/1987 | Meek et al. | 250/291 |
| 4,721,858 | 1/1988 | Buchanan et al. | 250/382 |
| 5,289,010 | 2/1994 | Shohet | 250/492.21 |
| 5,313,067 | 5/1994 | Houk et al. | 250/492.21 |

OTHER PUBLICATIONS

"Performance of an Ion Trap Inductively Coupled Plasma Mass Spectrometer", DW Koppenaal, CJ Barinaga, and MR Smith, J. Analytical Atomic Spectrometry vol. 9, pp. 1053–1058 (1994).

"Ion–Trap Mass Spectrometry with an Inductively Coupled Plasma Source", CJ Barinaga and DW Koppenaal, Rapid Communications in Mass Spectrometry, vol. 8, pp. 71–76 (1994).

"Effects of hydrogen mixed with argon carrier gas in electrothermal vaporization-ICP/MS" by N Shibata, N Fudagawa and M Kubota, Spectrochimica Acta Vol. 47B, pp. 505–516 (1992).

"Dissociation of analyte oxide ions in inductively copled plasma mass spectrometry", by E Poussel, MJ Mermet, and D Deruaz, J. of Analytical Atomic Spectrometry vol. 9, pp. 61–66 (1994).

"Use of Nitrogen and Hydrogen in ICP/MS" by H Louie and SY–P Soo, J. of Analytical Atomic Spectrometry vol. 7, pp. 557–564 (1992).

PE Walters and CA Barnardt, Spectrochimica Acta 43B, pp. 325–337 (1988).

"Alternatives to all–argon plasma in inductively coupled plasma mass spectrometry (ICP–MS): an overview", by SF Durrant, Fresenius'J. Analytical Chemistry 347, pp. 389–392 (1993).

"Fast atom bombardment of solids as an ion source in mass spectrometry", M Barber, RS Bordoli, RD Sedgwick, and AN Tyler, Nature vol. 293, pp. 270–275, Sep. 24, 1981.

"*Radio–frequency Glow Discharge Ion Trap Mass spectrometry*", by SA McLuckey and GL Glish, Anal. Chem. vol. 64, pp. 1606–1609, 1992.

*Primary Examiner*—Bruce Anderson

*Attorney, Agent, or Firm*—Douglas E. McKinley, Jr.

[57] ABSTRACT

A method for producing an ion beam having an increased proportion of analyte ions compared to carrier gas ions is disclosed. Specifically, the method has the step of addition of a charge transfer gas to the carrier analyte combination that accepts charge from the carrier gas ions yet minimally accepts charge from the analyte ions thereby selectively neutralizing the carrier gas ions. Also disclosed is the method as employed in various analytical instruments including an inductively coupled plasma mass spectrometer.

14 Claims, 7 Drawing Sheets

METHOD FOR REDUCTION OF SELECTED ION INTENSITIES IN CONFINED ION BEAMS

This invention was made with Government support under Contract DE-AC06-76RLO 1830 awarded by the U.S. Department of Energy. The Government has certain rights in the invention.

FIELD OF THE INVENTION

The present invention relates generally to a method for producing an ion beam having an increased proportion of analyte ions compared to carrier gas ions. More specifically, the method has steps resulting in selectively neutralizing carrier gas ions. Yet more specifically, the method has the step of addition of a charge transfer gas to the carrier analyte combination that accepts charge from the carrier gas ions yet minimally accepts charge from the analyte thereby selectively neutralizing the carrier gas ions.

BACKGROUND OF THE INVENTION

Many analytical or industrial processes require the generation of beams of ions of particular substances or analytes. For example, ion beams are used in ion guns, ion implanters, ion thrusters for attitude control of satellites, laser ablation plumes, and various mass spectrometers (MS), including linear quadrupole MS, ion trap quadrupole MS, ion cyclotron resonance MS, time of flight MS, and electric and/or magnetic sector MS. Several schemes are known in the art for generating such ion beams including electron impact, laser irradiation, ionspray, electrospray, thermospray, inductively coupled plasma sources, glow discharges and hollow cathode discharges. Typical arrangements combine the analyte with a carrier or support gas whereby the carrier gas is utilized to aid in transporting, ionizing, or both transporting and ionizing, the analyte.

For example, in a typical arrangement an analyte is combined with the carrier gas in an electrical field, whereupon the analyte and the carrier gas are ionized in a strong electric or magnetic field and later used in an analytical or industrial process. In another typical arrangement, the carrier gas is first ionized in a strong electric or magnetic field whereupon the analyte is then introduced into the ionized carrier gas. Electric fields are generated by a variety of methods well known in the art including, but not limited to, capacitive and inductive coupling.

In an inductive coupling arrangement, a radio frequency (RF) voltage is applied to a coil of a conducting material, typically brass. In the interior of the coil, one or more tubes supply a carrier gas, such as argon, and an analyte, which may be any substance. The analyte may be supplied in a variety of forms including but not limited to a gaseous form, as a liquid, as a droplet form as in an aerosol, or as a laser ablated aerosol. A large electrical field is generated within the coil. Within this field, any free electrons will initiate a chain reaction in the analyte and the carrier gas causing a loss of electrons and thus ionization of the carrier gas and the analyte. Several methods well known in the art, including but not limited to the introduction of a Tesla coil, the introduction of a graphite rod, or thermal emission of electrons, will provide free electrons causing initiation of a chain reaction. The result is a weakly ionized gas or plasma consisting of both free electrons and charged and uncharged species of the carrier gas and the analyte. The species of both the carrier gas and the analyte in the plasma may be in the form of particles, atoms or molecules, or a mixture of particles, atoms and molecules, depending on the particular species selected for use as the carrier gas and analyte.

The carrier gas and the analyte may be combined by a wide variety of methods well known in the art. For example, as described above, the analyte and the carrier gas in an aerosol form are combined and are then directed to the interior of a coil in an inductively coupled plasma. Another typical arrangement employs a needle which receives a liquid sample of analyte from a source such as a liquid chromatograph. Surrounding the needle is a tube which supplies a carrier gas such as argon as a high velocity atomizing carrier gas. Both the needle and the tube empty into a chamber. Upon discharge from the needle, the analyte liquid is evaporated and atomized in the argon carrier gas. Ions of both the evaporated liquid analyte and the argon carrier gas are produced by creating an electric field within the chamber. The electric field may be produced by creating a voltage difference between the needle and the chamber. A voltage difference may be created by applying a voltage to the needle and grounding the chamber.

The resultant plasma generated by any of the foregoing methods is typically directed towards either an analytical apparatus or towards a reaction zone wherein the carrier gas and analyte ions are analyzed or otherwise reacted or utilized in some fashion. The resultant plasma is typically directed by means of an electric or magnetic field, or by means of a pressure differential, or both. As the plasma is directed, the plasma is converted from a plasma to an ion beam. As used herein, the term "ion beam" refers to a stream consisting primarily of positively charged and neutral species. The bulk of the negatively charged species in the plasma are typically electrons, which are rapidly dispersed as the plasma is directed by either electric or magnetic fields or by a pressure differential. However, even after significant dispersal of the ion beam, the ion beam may not be completely void of negatively charged species. As the plasma progresses forward, the free electrons, due to their low mass relative to the positively charged ions, tend to disperse from the plasma, thus converting the plasma to an ion beam. Also, the ion beam itself will tend to disperse due to several effects. Most prominent among these effects is the repulsive forces of charged species within the ion beam. The beam is also dispersed through free jet expansion. The effect of dispersion of the constituent species in the ion beam is charge separation among those species and is well known in the art. The resultant ion beam is thus typically characterized by high net positive charge density which is primarily attributable to the relatively high abundance of positively charged carrier gas ions.

In many applications, the abundance of positively charged carrier gas ions and/or the resultant high charge density may be undesirable. For example, it is often desirable that the ion beam be focused through a small aperture, for example, if the analyte ions were to be analyzed in a mass spectrometer. In such an arrangement, where the ion beam is directed through an aperture, the high charge density will prescribe a space charge limit to the amount of the ion beam that may be passed through a given aperture. When the space charge limit is reached, the remainder of the beam is unable to pass through the aperture and is thus lost. In many applications, the portion of the beam which is lost includes analyte ions. Indeed, a loss of a portion of the beam may result in a disproportionate loss of some or all of the analyte ions because the analyte ions may not be evenly distributed throughout the ion beam or may not respond to the various dispersing forces in the same manner as the carrier gas ions.

Another example where the presence of carrier gas ions is undesirable is in an ion trap mass spectrometer where the ion trap has a limited ion storage capacity. In an ion beam directed at an ion trap, the carrier gas ions compete with analyte ions for the limited storage capacity of the ion trap. Thus, to the extent that carrier gas ions can be selectively eliminated from the ion beam, the storage capacity for analyte ions in the ion trap is thereby increased.

A third example where the presence of carrier gas ions is undesirable is any application where the analyte ions are to be used in a process or reaction where the carrier gas ions might interfere with such process. By way of further example, in many integrated circuit and chip manufacturing processes, ion beams may be directed towards a targeted material such as a silicon wafer to impart electrical or physical properties to the material. The desired properties are typically highly dependent on the specific ions directed at such materials. Thus, carrier gas ions may cause undesirable effects in the targeted materials.

Thus, in an ion beam having a carrier gas and an analyte, there exists a need for a method of selectively eliminating carrier gas ions without eliminating or neutralizing the analyte ions.

SUMMARY OF THE INVENTION

Accordingly, it is an object of the invention in one of its aspects to provide a method for producing an ion beam with increased proportion of analyte ions and a corresponding decreased number of carrier gas ions by neutralizing carrier gas ions while minimally removing or neutralizing the analyte ions. This is accomplished by providing the ion beam at a desired kinetic energy and directing the ion beam through a volume of a reagent gas thereby allowing the carrier gas to selectively transfer charge to the reagent gas rendering the reagent gas a charged species and the carrier gas a neutral species. As used herein, "selectively" means that the transfer of charge from the carrier gas ions to the reagent. gas proceeds at a rate at least ten times, and preferably over one thousand times, the rate of the transfer of charge from the analyte gas ions to the reagent gas. After this charge transfer, the charged reagent gas is then selectively dispersed, leaving an ion beam having a greater fraction of analyte ions to total ions. As used herein, charge transfer refers to any pathway wherein the net effect is that charge is exchanged between a charged species and a neutral species. The pathway may involve steps which are not charge transfer reactions. Steps within the pathway may include but are not limited to chemical reaction(s), alone or in series, such as resonant charge transfer(s), electron transfer, proton transfer, and Auger neutralization. As used herein, analyte ions refers to any ions generated by any means including but not limited to thermal ionization, ion beams, electron impact ionization, laser irradiation, ionspray, electrospray, thermospray, inductively coupled plasmas, microwave plasmas, glow discharges, arc/spark discharges and hollow cathode discharges. As used herein, reagent gas refers to any gas suitable for accepting charge transfer provided by any means including but not limited to commercially available substances provided in gaseous form and mixtures thereof and gases generated by evaporation of condensed substances or laser ablation of condensed substances. Further, reagent gas as used herein may include neutral species of analyte ions generated by any of the foregoing methods. Also, as will be apparent to those skilled in the art, the method of the present invention is not limited to systems containing a carrier gas per se. Typically, the two gas species are an analyte and a carrier gas. However, the method of the present invention will work equally well in any system having two or more ion species, even if none of the species were provided as a carrier gas. For example, in applications where daughter ions generated by the dissociation of any charged species are undesirable, suitable reagents may be selected to remove or neutralize those daughter ions by charge transfer. Similarly, a particular analyte may contain a substance of interest in mixture with a separate interfering substance. Suitable reagents may be selected to remove or neutralize the separate interfering substance by charge transfer.

In a preferred embodiment of the invention, the carrier gas selected is argon and the reagent gas selected is hydrogen. Accordingly, it is an object of the invention in one of its aspects to provide a method for selectively reducing the charge density of an ion beam by neutralizing the ions of an argon carrier gas, without eliminating or neutralizing the analyte ions. This is accomplished by directing the ion beam through a volume of hydrogen at kinetic energies wherein the argon ions selectively transfer charge to the hydrogen. In this manner, it is theorized that the bulk of the ion beam is selectively shifted from a mass to charge ratio (m/z) of 40 ($Ar^+$) to m/z 3 ($H_3^+$) and m/z 2 ($H_2^+$). It is therefore a further object of the invention in one of its aspects to provide a method allowing the selective transfer of charge from $Ar^+$ to $H_2$. Due to hydrogen's lower molecular weight, in many applications it is possible to rapidly and selectively eject $H_3^+$ and $H_2^+$ from an ion beam without ejecting analyte ions where it would have been difficult or impossible to selectively eject $Ar^+$ ions from the ion beam without also ejecting or removing analyte ions. Thus, it is therefore a further object of the invention in one of its aspects to provide a method for rapidly ejecting $H_3^+$ and $H_2^+$ from an ion beam, yet minimally reducing or ejecting analyte ions.

Thus, it is a further object of the invention in one of its aspects to provide a method for providing a beam selectively depleted in $Ar^+$, and therefore having a much lower total ion density, yet minimally reduced ion density of analyte.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DESCRIPTION OF THE PREFERRED EMBODIMENT(S)

Figure 1:
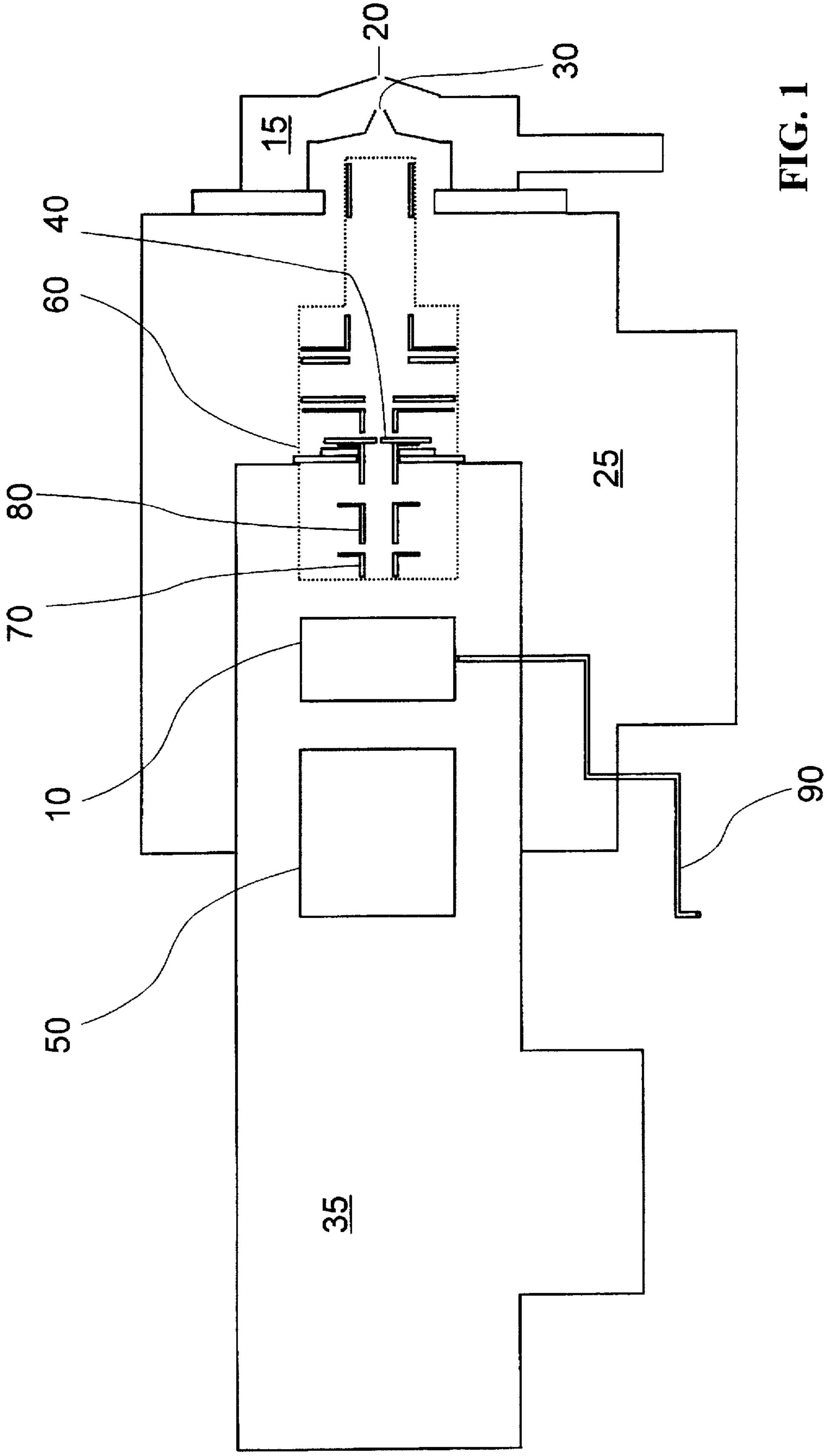
FIG. 1 is a schematic drawing of the apparatus used in the first preferred embodiment of the present invention.

The method of transferring charge from selected ions in an ion beam having more than one species of ions to a reagent gas and thereafter preferentially dispersing the charged reagent gas was demonstrated in inductively coupled plasma mass spectrometers (hereafter called ICP/MS). An ICP/MS is a device wherein a plasma consisting of a carrier gas (typically argon) and an analyte is generated in an inductively coupled plasma (ICP) and a mass spectrometer is employed to separate and distinguish constituent atoms and isotopes. For both convenience of operation and to maintain a desirable temperature in the plasma, the ICP is typically operated at atmospheric pressure. In order to transfer ions from the plasma to a mass spectrometer, the plasma is directed through two apertures and then through a lens stack. The plasma is thereby converted into an ion beam containing analyte ions and carrier gas ions. A lens stack typically consists of a series of metal pieces, typically plates and/or cylindrical tubes which have potentials applied to them and which have apertures through which the ion beam is directed. The ion beam is directed through these charged plates which focus the ion beam into a narrow stream which is directed to a ion discriminating unit, typically a linear quadrupole. As used herein, ion discriminating unit refers to any apparatus which separates charged species according to their m/z and/or kinetic energy. Ion discriminating units include but are not limited to a linear quadrupole, an ion trap, a time-of-flight tube, a magnetic sector, an electric sector, a combination of a magnetic sector and an electric sector, a lens stack, a DC voltage plate, an rf/dc multipole ion guide and an rf multipole ion guide. Modified ICP/MS systems have been built which use a three dimensional RF quadrupole ion trap, either alone or in combination with a linear RF quadrupole as an ion discriminating unit. Upon exiting the lens stack, the ion beam is directed into the ion discriminating unit. Ions are selectively emitted from the ion discriminating unit according to their mass to charge ratio (m/z) and/or kinetic energy. These selectively emitted ions are then directed to a charged particle detector. In this manner, the ICP/MS is able to determine the presence of selected ions in an analyte according to their (m/z) and/or kinetic energy. It is critical to maintain the ion discriminating unit in a vacuum because collisions or reactions between the ions and any gases present in the ion discriminating unit will tend to deflect ions away from the charged particle detector or neutralize the ions of analyte. It is critical to maintain the charged particle detector in a vacuum because the high potential across the detector will cause an electrical discharge in any gas present in sufficient pressure, typically above $10^{-4}$ Torr. One or more pumps are thus typically utilized to evacuate a series of chambers in between the ICP and the charged particle detector. The chambers are separated by one or more apertures to achieve the transition from atmospheric pressure at the ICP to high vacuum at the charged particle detector (typically between about $10^{-7}$ and $10^{-4}$ torr). To effect the large differential in pressure, ICP/MS systems typically employ apertures between approximately 0.5 mm to approximately 2 mm.

In operation, the reagent gas is introduced within an ion beam having a carrier gas and an analyte to allow the charge of the carrier gas ions to be transferred to the reagent gas, whereupon the now charged reagent gas may be selectively dispersed from the ion beam. The extent of reaction or completeness of this charge transfer will be driven by at least four factors. First, any two species selected will have an inherent rate of reaction which will affect the completeness of charge transfer over a given period of time, all other things held constant. Second, lower velocities of the carrier gas ions will provide a longer residence time for carrier gas ions in the reaction zone and thereby provide a greater extent of reaction. Third, there is a velocity dependence for the reaction cross section which is in general different for any given reacting species so that for any given reaction the optimum velocity may be low or high. Thus, the completeness of charge transfer in a given time period is increased as the probability of a collision between carrier gas ions and reagent gas species is increased. Therefore, the completeness of charge transfer is dependent upon the pressure of the reagent gas and the time that the two gases are in contact. If the reagent gas species is present at low concentration or pressure, the carrier gas ions must have sufficient opportunities to come into contact with the reagent gas, i.e., a long residence time must be employed.

As will be apparent to those skilled in the art, although the present invention has been described as employed in an ICP/MS, the method of the present invention may be advantageously applied in any system having a carrier gas and an analyte gas where it is desired to remove or neutralize the carrier gas ions. The ICP/MS system, as well as the instruments described in the preferred embodiments which follow, both practice and are demonstrative of the present invention because they contain detection methods to verify the selective neutralization or removal of carrier gas ions.

THE FIRST PREFERRED EMBODIMENT

In a first preferred embodiment shown in FIG. 1, a conventional ICP/MS manufactured by VG Elemental, now Fisons (Winsford, Cheshire, England; model PQ-I) was modified by replacing the linear quadrupole and its associated electronics (not shown) with an RF quadrupole ion trap 10 and its associated electronics (not shown). The ion trap 10 was installed with the ion input and output ends reversed to maximize the ion transfer efficiency from the lens stack 60 into the ion trap 10. The ion trap 10 used was removed from an ion trap mass spectrometer manufactured by Finnigan MAT (San Jose, Calif.). The electron gun (not shown) and injection gate electrode assembly (not shown) were removed to allow transfer of ions from the lens stack 60 into the ion trap 10. The vacuum system was modified from a standard Fisons vacuum system and consisted of three vacuum regions separated by two apertures. These vacuum regions are evacuated by standard vacuum pumps (not shown). The first vacuum region 15 is contained in between a first aperture 20 and second aperture 30 and is typically operated at 0.1 to 10 Torr. The second vacuum region 25 is contained between the second aperture 30 and a third aperture 40 and is typically operated at $10^{-5}$ to $10^{-3}$ Torr. The third aperture 40 is located within the lens stack 60 at substantially the same position as employed in the standard Fisons ICP/MS. The third vacuum region 35 is separated from the second vacuum region 25 by the third aperture 40. The third vacuum region 35 contains a portion of the lens stack 60, the ion trap 10 and a charged particle detector So. The third vacuum region 35 is typically operated at $10^{-8}$ to $10^{-3}$ Torr.

EXPERIMENT 1

A series of experiments was performed utilizing the apparatus described in the first preferred embodiment. The configuration of the various components is shown in FIG. 1. The vacuum regions 15,25,35 were operated under conventional conditions as described above. The potentials applied to the lens stack 60 were within the ranges recommended by the manufacturer of the ICP/MS (Fisons). The first and second apertures 20,30 were both grounded. The third aperture 40 was biased at a DC potential of about −120 V. The potentials on the lens stack plates 70,80 were optimized for maximum transfer efficiency of ions into the ion trap 10 and were different than the potentials used in conventional ICP/MS instruments. Ions are gated into the ion trap 10 by switching the potential on plate 80 in the lens stack 60. The potentials on plate 80, described as lens element L3 by the manufacturer (Fisons), were switched between a negative value used to admit ions into the ion trap 10, in the range between about −10 V to about −500 V, preferably −35 V, and a positive value used to prevent ions from entering the ion trap 10, in the range between about +10 V to about +500 V, preferably above +10 V, or the kinetic energy of the ions. The electronic gating control (not shown) used for switching the voltage on plate 80 was provided by inverting the standard signal provided by the Finnigan MAT ITMS to gate electrons. This inversion was accomplished using an extra inverter (not shown) on the printed circuit board (not shown) that performs the gating.

The ion trap 10 is manufactured with a port 90 typically used for introduction of a buffer gas such as helium. Reagent gases were introduced into the ion trap 10 by adding the reagent gases to the helium. Typical helium buffer gas pressures were in the range between about $10^{-5}$ and $10^{3}$ Torr. Reagent to buffer gas pressure ratios ranged between about 0.01% to 100%. Experiments were performed in this instrument wherein Ar, $H_2$, Xe, or Kr were introduced as reagent gases into the ion trap 10.

Figure 2:
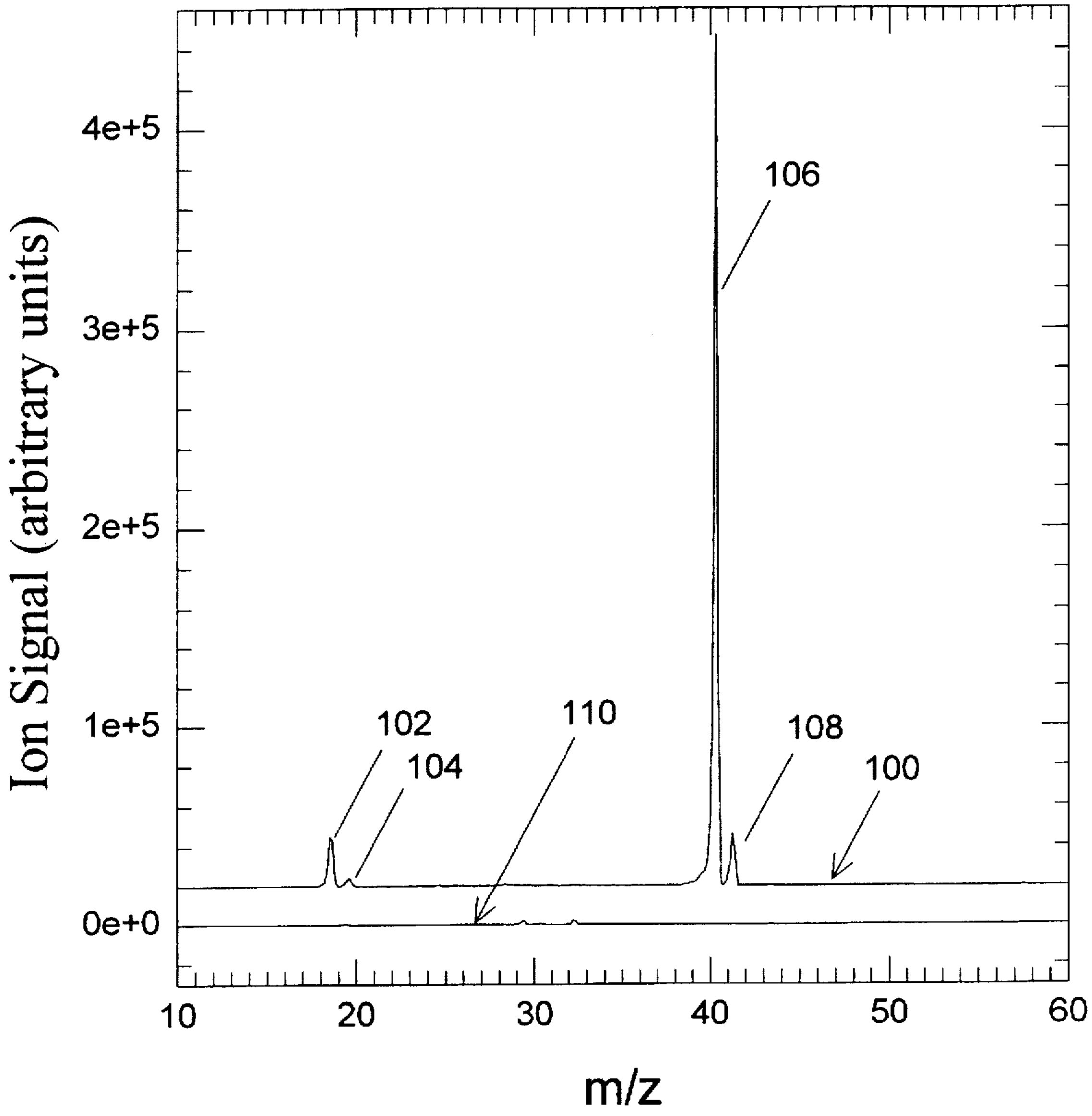
FIG. 2 contains two mass spectra from experiments performed in the apparatus used in the first preferred embodiment of the present invention.

The effect of these reagent gases on the analyte and ion signals were observed by recording the ion trap mass spectrum. Representative mass spectra showing the effects of added $H_2$ are shown in FIG. 2. The upper trace 100 in FIG. 2 was obtained using pure helium buffer gas and is offset from zero for the sake of clarity in FIG. 2. The lower trace 110 in FIG. 2 was obtained using about 5% $H_2$ and about 95% helium. The upper trace 100 shows the intensity of various peaks, most notably, $H_2O^+$ at m/z 18 102, $H_3O^+$ at m/z 19 104, $Ar^+$ at m/z 40 106, $ArH^+$ at m/z 41 108. With the addition of $H_2$ as a reagent gas, $Ar^+$, $H_2O^+$, $Ar^+$, and $H_3O^+$ are dramatically reduced as indicated by the reduction of peak intensities at the appropriate m/z in the lower trace 110, indicating the near or total elimination of these charged species.

In addition to the elimination of these charged species, one must also be concerned with the effect of any added reagent gases on the analyte ions. The following elements were tested as analyte ions for reaction with $H_2$ in the apparatus of the first preferred embodiment as described above using argon as carrier gas: Mg, Al, K, Ca, Sc, Ti, V, Cr, Mn, Fe, Co, Ni, Cu, Zn, Ga, As, Se, Rb, Sr, Ag, Cd, In, Xe, Cs, Ba, Tl, Pb, Bi, and U. In all of the experiments, the reduction in $Ar^+$ intensity was at least 100,000 times greater than the reduction in any of the intensities of those analyte ions.

THE SECOND PREFERRED EMBODIMENT

Figure 3:
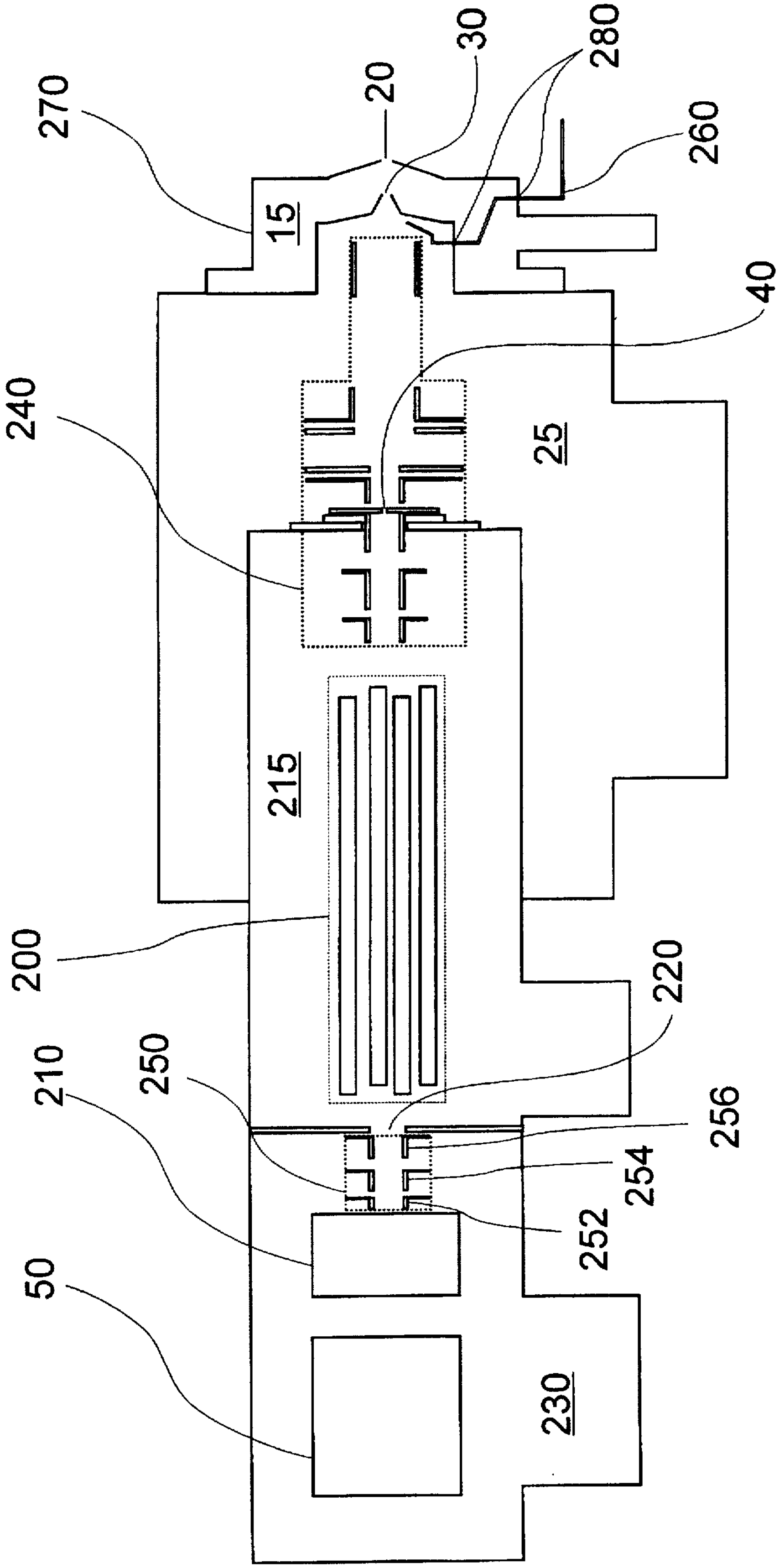
FIG. 3 is a schematic drawing of the apparatus used in the second preferred embodiment of the present invention.

In a second preferred embodiment as shown in FIG. 3, a conventional ICP/MS manufactured by VG Elemental, now Fisons (Winsford, Cheshire, England; model PQ-I) was modified by interposing an RF quadrupole ion trap 210 between the linear quadrupole 200 and the charged particle detector 50. Although, the electrodes (not shown) used in the ion trap 210 were custom built to be scaled versions of the ITMS electrodes manufactured by Finnigan MAT (San Jose, Calif.), standard ion trap electrodes would work equally well. The electrodes of the custom built ion trap 210 were 44% larger than the electrodes of the Finnigan MAT ITMS and were assembled in a pure quadrupole, or un-stretched geometry. The standard ITMS electronics package (not shown) manufactured by Finnigan MAT was used with the modifications as described in the first preferred embodiment using the voltages as described below.

The standard lens stack 240 is operated at potentials recommended by the manufacturer. In addition to the standard lens stack 240, a second lens stack 250 is interposed between the third aperture 220 and the ion trap 210 in the fourth vacuum region 230. The second lens stack 250 consisted of three plates 252,254,256 taken from standard Fisons lens stacks, specifically two L3 plates and an L4 plate. The second lens stack 250 was fabricated to provide high ion transport efficiency between the linear quadrupole 200 and the ion trap 210. A potential of between about −10 V and about −300 V, preferrably about −30 V were applied to plates 252,256 at each end of the second lens stack 250. The center plate 254 was used to gate ions into the ion trap 210 and the potential applied was varied between about −180 V for the open potential and about +180 volts for the closed potential. The electronic gating control (not shown) used for the center plate 254 of the second lens stack 250 was provided by inverting the standard signal provided by the Finnigan MAT ITMS to gate electrons. This inversion was accomplished using an extra inverter (not shown) on the printed circuit board (not shown) that performs the gating.

The vacuum system was the standard Fisons system consisting of four vacuum regions separated by three apertures with an additional pump on the fourth vacuum region 230. These vacuum regions are evacuated by standard vacuum pumps (not shown). The first vacuum region 15 is contained in between a first aperture 20 and second aperture 30 and is typically operated at 0.1 to 10 Torr. The second vacuum region 25 is contained between the second aperture 30 and a third aperture 40 and is typically operated at $10^{-5}$ to $10^{-3}$ Torr. The third aperture 40 is located within the lens stack 240. The third vacuum region 215 is contained between the third aperture 40 and the fourth aperture 220 and is typically operated at $10^{-8}$ to $10^{-4}$ Torr. The third vacuum region 215 contains the linear quadrupole 200. The fourth vacuum region 230 is separated from the third vacuum region 215 by the fourth aperture 220. The fourth vacuum region 230 contains the ion trap 210 and a charged particle detector 50. The fourth vacuum region 230 is typically operated at $10^{-8}$ to $10^{-3}$ Torr.

As illustrated in FIG. 3, a 1/16 " diameter metal tube 260 was provided to allow the introduction of reagent gases into the second vacuum region 25 through two ports 280 provided in the housing 270 surrounding the first vacuum region 15. The tube 260 was fashioned into a shape so as to avoid electrical contact with the lens stack 240 and to position the end of the tube 260 approximately 1 cm behind the base of the second aperture 30 and approximately 1 cm from the central axis defined by the four apertures 20,30, 40,220. In this way, reagent gases are introduced into the second vacuum region 25 as close to the second aperture 30 as possible without interfering with the gas dynamics of the sampled plasma and with minimal distortion of the electric field generated by the lens stack 240.

EXPERIMENT 2

A series of experiments was performed utilizing various reagent gases and an argon carrier gas in the above described apparatus shown in FIG. 3. Reagent gases, $H_2$, Ar, Xe, Kr and an Ar/Xe/Kr mixture, were introduced via tube 260 into the second vacuum region 25. Mass spectra were obtained for reagent gas partial pressures in vacuum region 25 between zero and about 1 mTorr to about 10 mTorr. Table I lists relative rates of reaction for the carrier gas and analyte ions shown in the first column with increasing pressure of the reagent gases listed at the top of the remaining columns. Thus, by way of example, the values in the second column under the heading "$H_2$" show that as the $H_2$ pressure is increased, the $Ar^+$ ion intensity falls about 10 times faster than the $In^+$ ion intensity, confirming the selective removal of carrier gas ions.

TABLE I

Relative Reaction Rates of Carrier Gas Ions and Analyte Ions with Reagent Gases

| Ions | $H_2$ | Ar | Ar/Xe/Kr |
|---|---|---|---|
| $Ar^+$ | 0.1 | 0.6 | — |
| $ArH^+$ | non-linear | 0.35 | 0.25 |
| $Sc^+$ | 0.017 | 0.23 | 0.18 |
| $^{84}Kr^+$ | 0.06 | — | 0.26 |
| $^{115}In^+$ | 0.01 | 0.24 | 0.14 |
| $^{129}Xe^+$ | 0.01 | — | 0.15 |

THE THIRD PREFERRED EMBODIMENT

Figure 4:
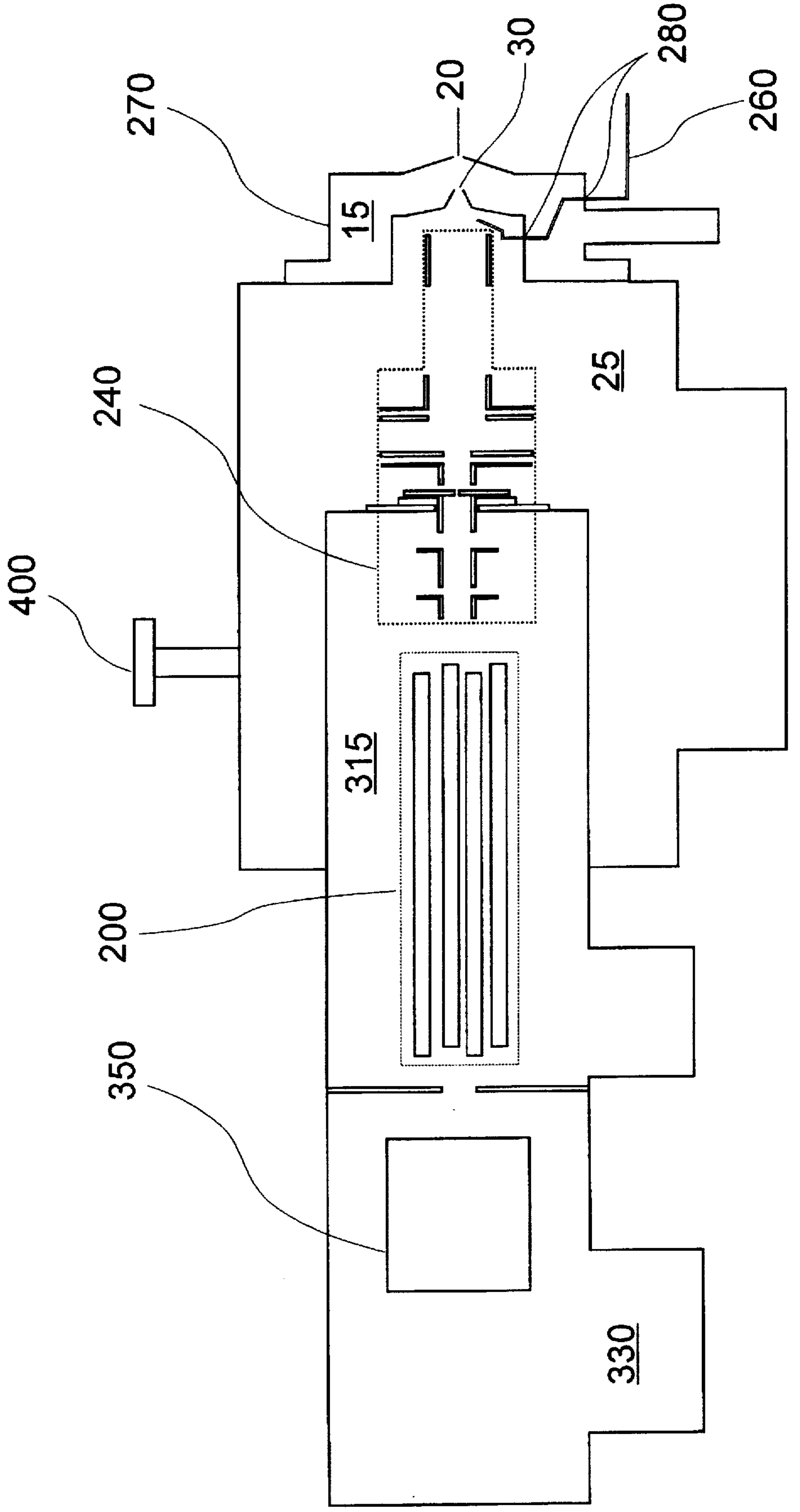
FIG. 4 is a schematic drawing of the apparatus used in the third preferred embodiment of the present invention.

In a third preferred embodiment shown in FIG. 4, a conventional ICP/MS manufactured by VG Elemental, now Fisons (Winsford, Cheshire, England; model PQ-II+) was modified by providing a 1/16" diameter metal tube 260 to allow the introduction of reagents into the second vacuum region 25 in a manner identical to the second preferred embodiment. As shown in FIG. 4, the remainder of the ICP/MS was not modified from that provided by the manufacturer. A series of experiments was performed utilizing an argon carrier gas and $H_2$ as a reagent gas introduced via tube 260 into the second vacuum region 25. Mass spectra were obtained for $H_2$ pressure in the second vacuum region 25 between zero and about 2 mTorr and are summarized below.

EXPERIMENT 3

Figure 5:
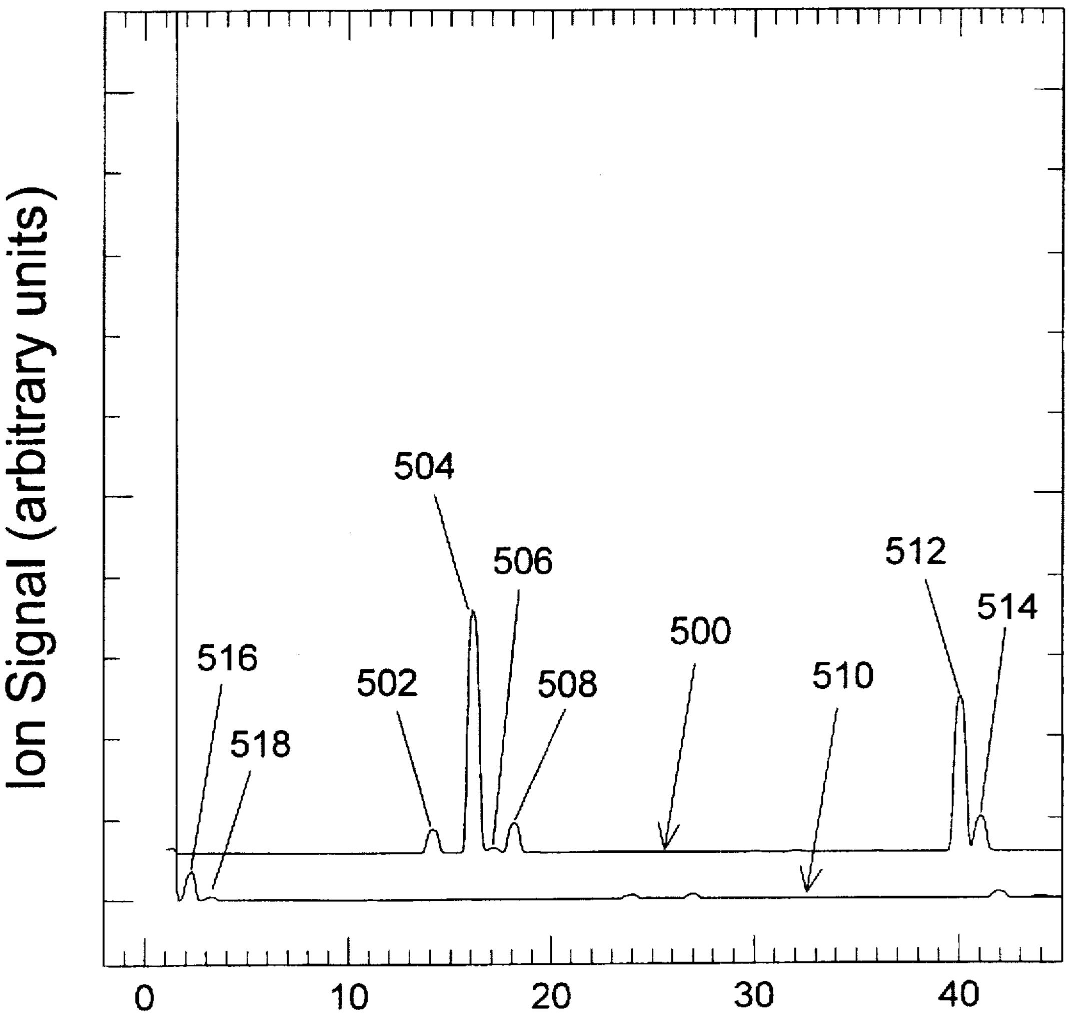
FIG. 5 contains two mass spectra from experiments performed in the apparatus used in the third preferred embodiment of the present invention.
Figure 6:
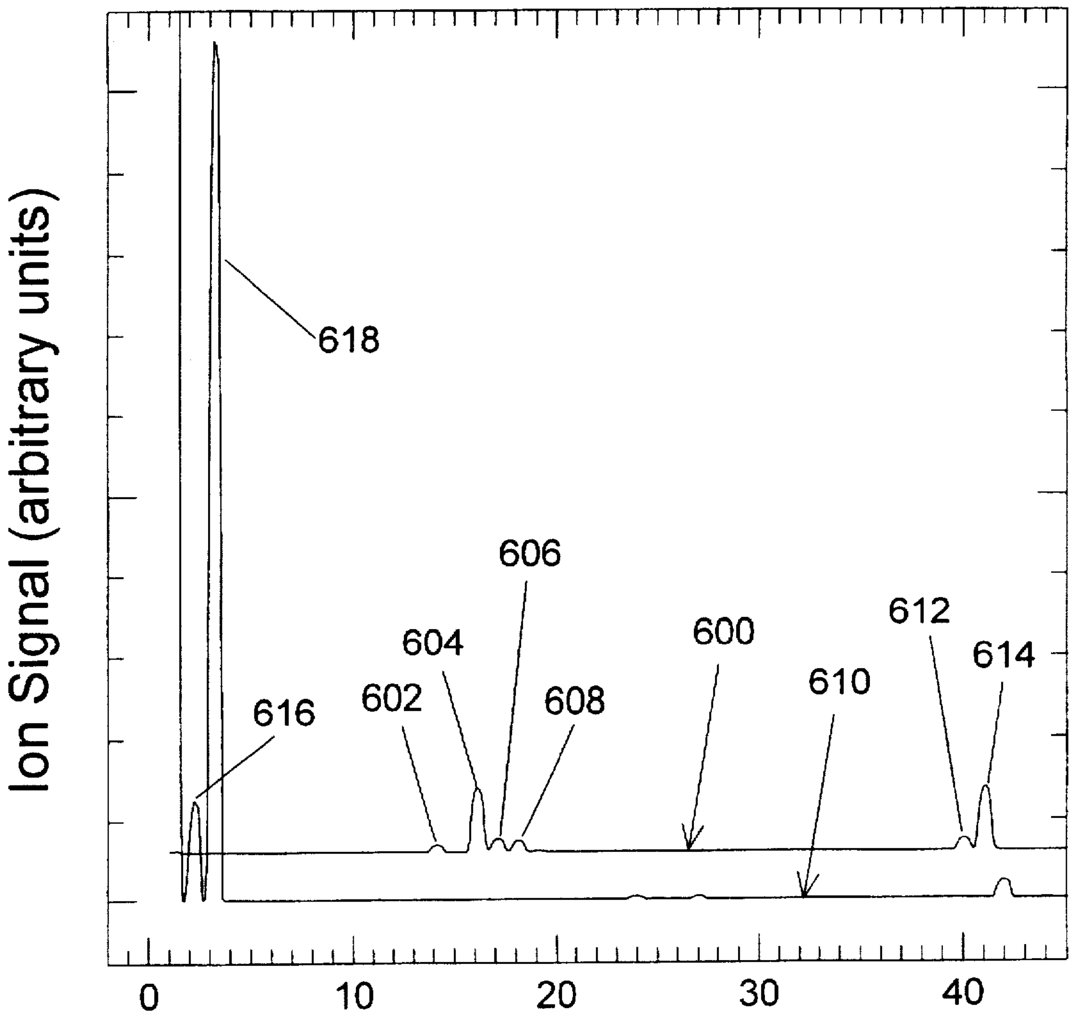
FIG. 6 contains two mass spectra from experiments performed in the apparatus used in the third preferred embodiment of the present invention.

The effect of $H_2$ pressure on the analyte and ion signals were observed by recording the mass spectrum in both the analog and pulse counting modes of operation of the ICP/MS as provided by the manufacturer. Two mass spectra recorded without addition of $H_2$ into the second vacuum region 25 are shown in FIG. 5. The upper trace 500 in FIG. 5 was obtained using the analog mode of operation. The lower trace 510 in FIG. 5 was obtained using the pulse counting mode of operation. The upper trace 500 shows the intensity of various peaks, most notably, $N^+$ at m/z 14 502, $O^+$ at m/z 16 504, $OH^+$ at m/z 17 506, $H_2O^+$ at m/z 18 508, $Ar^+$ at m/z 40 512, $Ar^+$ at m/z 41 514, $H_{2^+}$ at m/z 2 516, and $H_3^+$ at m/z 3 518. Two mass spectra recorded with addition of a pressure of about 2 mTorr $H_2$ into the second vacuum region 25 are shown in FIG. 6. The upper trace 600 in FIG. 6 was obtained using the analog mode of operation. The lower trace 610 in FIG. 6 was obtained using the pulse counting mode of operation. The vertical and horizontal scales of FIG. 5 and FIG. 6 are the same. The same ion peaks are labeled in FIG. 6 as in PIG. 5, namely, $N^+$ at m/z 14 602, $O^+$ at m/z 16 604, $OH^+$ at m/z 17 606, $H_2^+$ at m/z 18 608., $Ar^+$ at m/z 40 612, $ArH^+$ at m/z 41 614, $H_2^+$ at m/z 2 616, and $H_3^+$ at m/z 3 618.

As the mass spectra in FIG. 5 and FIG. 6 show, this method of implementation allows the direct detection of $H_3^+$ produced in the reaction of $Ar^+$ with $H_2$. The formation of this ion is strongly inferred from the experiments performed in the apparatuses of the first two embodiments, but $H_3^+$ could not be detected using the Finnigan MAT ion trap mass spectrometers. Inasmuch as this method produces a mass spectrum in the same way as a conventional ICP/MS instrument, polyatomic ions which are commonly observed in conventional ICP/MS, but not by using the methods of the first and second preferred embodiments, may also be observed here. Thus, for example, the effect of elevated $H_2$ pressures in vacuum region 25 on $Ar^+$ may be observed along with the effects on $ArO^+$ and $Ar_2^+$.

The most dramatic effect of added $H_2$ is an approximately 200-fold increase in the intensity of the $H_{3^+}$ peak 618. Addition of $H_2$ also causes an approximately 10-fold decrease in the intensity of the $Ar^+$ peak 612 and an approximately 2-fold increase in the intensity of the $Ar^+$ peak 614. These mass spectra show minimal reduction (less than 10%) in the intensity of the peaks for other analytes (not shown). These mass spectra thus show a selective removal of $Ar^+$ and an increase in $H_3^+$ thereby confirming the mechanism of charge transfer in the reaction of $H_2$ with $Ar^+$.

EXPERIMENT 4

A series of experiments was also performed utilizing the ICP/MS with no modifications other than adjusting the potentials in the lens stack 240 to reduce the kinetic energy of the ions from typical values under normal operating conditions. $H_2$ was introduced as a reagent gas into the second vacuum region 25 via the vacuum port 400 provided by the manufacturer for pressure measurements. $H_2$ pressures ranged from about 0.1 mTorr to about 1 mTorr. The measured $Ar^+$ intensity was reduced by a factor of two with the introduction of the $H_2$ reagent gas, demonstrating that introduction of $H_2$ into the second vacuum region 25 of an unmodified ICP/MS can be used to reduce the $Ar^+$ ion intensity. We further observed an increase of about a factor of 10 in signal at m/z 41, indicating formation of $ArH^+$ consistent with the experimental observations from the apparatus of the first embodiment.

Table II contains selected data from the experiments performed using the apparatus of the first, second, and third preferred embodiments described herein. Each row of the table gives reduction factors for $Ar^+$ and an analyte ion as well as the ratio of these reduction factors. The ratio is the selectivity with which the $Ar^+$ intensity in the mass spectrum is reduced relative to the intensity of the analyte ion. The entries in the first column in Table II lists the preferred embodiment used to obtain the data given in each row. The second column in Table II lists the reagent gas used. The reagent gas was introduced into the ion trap 20 for the results shown in Table II for the first preferred embodiment above. The reagent gas was introduced in vacuum region 25 for the results shown in Table II for the second and third embodiments. Thus, by way of example, the third row in Table II shows that the reaction of the carrier gas ion ($Ar^+$) leads to a 30-fold reduction in $Ar^+$ intensity under conditions that reduce the intensity of $Sc^+$ by a factor of two.

TABLE II

Selectivity of $Ar^+$ Removal

| | | Reduction Factors | | |
|---|---|---|---|---|
| Embodiment | Reagent | $Ar^+$ | Analyte | |
| First | $H_2$ | 100,000 | ($In^+$) < 5% | 1,000,000 |
| Second | Ar | 300 | ($Sc^+$) 7 | 45 |
| Second | $H_2$ | 30 | ($Sc^+$) 2 | 15 |
| Third | $H_2$ | 10 | ($In^+$) < 10% | 100 |

THE FOURTH PREFERRED EMBODIMENT

Figure 7:
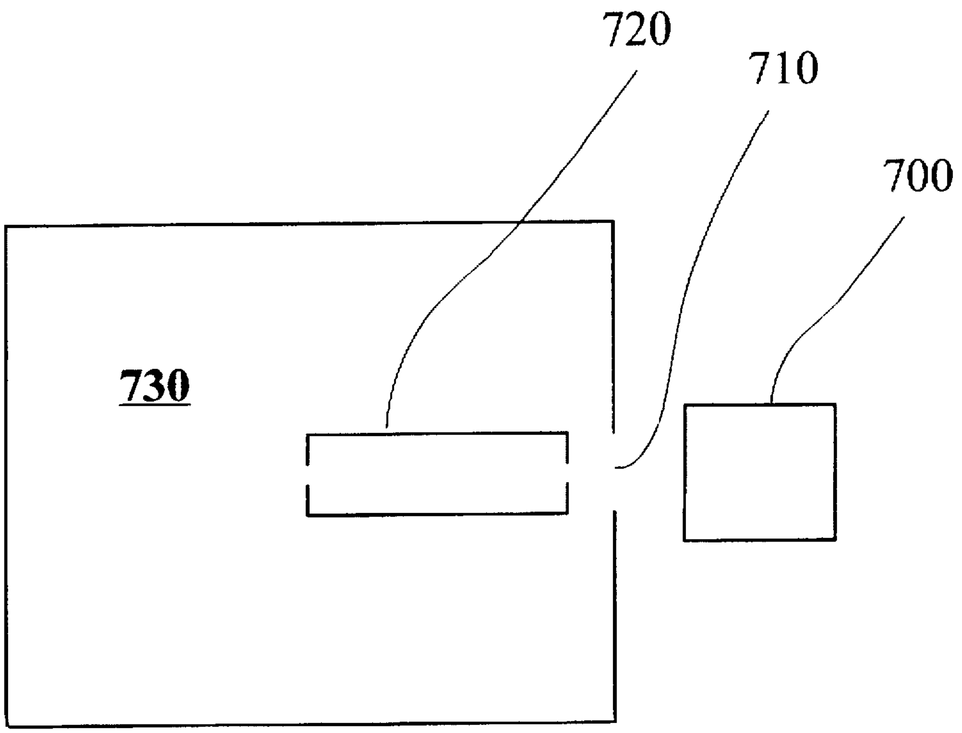
FIG. 7 is a schematic drawing of the apparatus used in the fourth preferred embodiment of the present invention.

In a fourth preferred embodiment as shown in FIG. 7, carrier gas ions and analyte ions generated from an ion source 700 are directed through a first aperture 710 to a cell 720 where the ions are allowed to react with a reagent gas. Suitable ion sources include, but are not limited to thermal ionization sources, electron impact, laser irradiation, ion spray, electrospray, thermospray, inductively coupled plasma sources, arc/spark discharges, glow discharges, hollow cathode discharges and microwave plasma sources. While the fourth preferred embodiment as described herein is limited to what are considered its essential components, it will be apparent to those skilled in the art that the fourth preferred embodiment could readily be constructed using conventional ICP/MS components as described in prior preferred embodiments. The cell is contained within a first vacuum region 730. The cell 720 confines ions in a region close to the aperture 710 through which the ions are introduced into the first vacuum region 730. In this manner, ions are directed from the ion source 700 to the cell 720 with minimum opportunity for ion dispersion. The first vacuum region 730 is made to contain the optimal pressure of reagent gas which allows both ion transport through the cell 720 and sufficient charge transfer between the carrier gas ions and the reagent gas.

The cell 720 also can be made to control the kinetic energy of the ions. Thus, the cell 720 can be used to increase the residence time the carrier gas ions are in contact with the reagent gas and thus to increase the extent of charge transfer. Also, the cell 720 can be made to discriminate against, i.e., not transmit, slow ions by application of velocity or kinetic energy discriminating methods, such as the application of suitable DC electric fields. In this manner, charge exchange between fast carrier gas ions and slow reagent gas neutrals can be used to remove selected carrier gas ions from the ion beam. The kinetic energy of the ions in the cell 720 is maintained as high as possible so as to minimize space charge expansion of the ions, but low enough for a given pressure of reagent gas to allow sufficient charge transfer. The optimal pressure of the reagent gas will be limited by acceptable analyte ion scattering losses in the cell and practical considerations such as pumping requirements.

As an example, the fourth preferred embodiment may be operated using argon as the carrier gas. The cell 720 may be provided as any apparatus suitable for confining the ions in the first vacuum region 730, including but not limited to, an ion trap, a long flight tube, a lens stack or an RF multipole ion guide. For example, by selecting the cell 720 as an RF multipole ion guide, the cell 720 may be operated to selectively disperse reagent gas ions from the ion beam. By selecting a reagent gas having a low mass, such as $H_2$, the RF multipole ion guide may be operated with a low mass cut-off greater than m/z 3. In this manner, $H_2^+$ and $H_3^+$, which are formed as charge transfer products, are selectively dispersed from the ion beam by virtue of their low m/z.

The resultant ion beam may then be utilized as one of any number of end uses including but not limited to an ion gun or an ion implanter. Further, the resultant beam may be analyzed in various apparatus including but not limited to an optical spectrometer, mass spectrometers (MS), including linear quadrupole MS, ion trap quadrupole MS, ion cyclotron resonance MS, time of flight MS, and magnetic and/or electric sector MS. Finally, the resultant ion beam may be directed through any electrical or magnetic ion focusing or ion directing apparatus, including but not limited to, a lens stack, an RF multipole ion guide, an electrostatic sector, or a magnetic sector.

The resultant ion beam thus has an increased proportion of analyte ions compared to carrier gas ions. Thus, in any of the suggested uses wherein the resultant ion beam is directed through an aperture at the space charge current limit, the increased proportion of analyte ions compared to carrier gas ions directed into the aperture will create an increase in the rate at which the analyte ions pass through the aperture.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. An improved method of providing an ion beam in a system where a mixture of carrier gas ions and analyte ions is provided, wherein the improvement comprises:

a) exposing said mixture to a reagent gas, and b) selectively transferring charge from the carrier gas ions to the reagent gas, thereby neutralizing the carrier gas ions and forming a charged reagent gas.

2. The method of claim 1 further comprising the step of selectively removing the charged reagent gas from the ion beam.

3. The method of claim 2 further comprising the step of providing an ion discriminating unit for selectively removing the charged reagent gas from the ion beam.

4. The method of claim 3 wherein the ion discriminating unit provided is selected from the group comprising a linear quadrupole, an ion trap, a time-of-flight tube, a magnetic sector, an electric sector, a combination of a magnetic sector and an electric sector, a lens stack, a DC voltage plate, an rf multipole ion guide, or an rf/dc multipole ion guide.

5. The method of claim 1 wherein the carrier gas is selected from the group consisting of He, Ne, Ar, Kr, Xe and combinations thereof.

6. The method of claims 1 wherein the reagent gas is selected from the group consisting of $H_2$, $D_2$, HD, $N_2$, He, Ne, Ar, Kr, Xe and combinations thereof.

7. The method of claim 1 wherein the analyte ions are provided by a method selected from the group consisting of thermal ionization, ion beams, electron impact ionization, laser irradiation, ionspray, electrospray, thermospray, inductively coupled plasmas, microwave plasmas, glow discharges, arc/spark discharges, hollow cathode discharges, gases generated by evaporation of condensed substances, laser ablation of condensed substances and mixtures thereof.

8. In an inductively coupled plasma mass spectrometer having a mixture of analyte gas ions and carrier gas ions, a method of increasing the ratio of the analyte gas ions to the carrier gas ions comprising the steps of:

a) exposing said mixture to a reagent gas, and b) selectively transferring charge from the carrier gas ions to the reagent gas, thereby neutralizing the carrier gas ions and forming a charged reagent gas.

9. The method of claim 8 further comprising the step of selectively removing the charged reagent gas from the ion beam.

10. The method of claim 9 further comprising the step of providing an ion discriminating unit for selectively removing the charged reagent gas from the ion beam.

11. The method of claim 10 wherein the ion discriminating unit provided is selected from the group comprising a linear quadrupole, an ion trap, a time-of-flight tube, a magnetic sector, an electric sector, a combination of a magnetic sector and an electric sector, a lens stack, a DC voltage plate, an rf multipole ion guide, or an rf/dc multipole ion guide.

12. The method of claim 8 wherein the carrier gas is selected from the group consisting of He, Ne, Ar, Kr, Xe and combinations thereof.

13. The method of claim 8 wherein the reagent gas is selected from the group consisting of $H_2$, $D_2$, HD, $N_2$, He, Ne, Ar, Kr, Xe and combinations thereof.

14. In an inductively coupled plasma mass spectrometer having a mixture of analyte gas ions and argon carrier gas ions, a method of increasing the ratio of the analyte gas ions to the carrier gas ions comprising the steps of:

a) exposing said mixture to a reagent gas containing hydrogen in a cell, and b) selectively transferring charge from the carrier gas ions to the hydrogen, thereby neutralizing the carrier gas ions and transferring charge to the hydrogen.

* * * * *